US006577166B2

(12) United States Patent
Lim

(10) Patent No.: US 6,577,166 B2
(45) Date of Patent: Jun. 10, 2003

(54) VOLTAGE LEVEL DETECTOR AND VOLTAGE GENERATOR USING THE SAME

(75) Inventor: Kyu-Nam Lim, Suwon (KR)

(73) Assignee: Samsung Electronics Co., Ltd., Kyoungki-do (KR)

( * ) Notice: Subject to any disclaimer, the term of this patent is extended or adjusted under 35 U.S.C. 154(b) by 0 days.

(21) Appl. No.: 09/981,964

(22) Filed: Oct. 19, 2001

(65) Prior Publication Data

US 2002/0060561 A1 May 23, 2002

(30) Foreign Application Priority Data

Oct. 19, 2000 (KR) ........................................ 2000-61574

(51) Int. Cl.[7] ............................ H03K 5/153; G05F 1/10
(52) U.S. Cl. .......................... 327/77; 327/143; 327/535
(58) Field of Search ............................. 327/77, 80, 81, 327/89, 142, 143, 198, 534, 537, 536, 535

(56) References Cited

U.S. PATENT DOCUMENTS 5,270,584 A * 12/1993 Koshikawa et al. ........ 327/534
5,721,510 A * 2/1998 Miyajima .................. 327/536
5,723,990 A * 3/1998 Roohparvar ................ 327/81
6,411,157 B1 * 6/2002 Hsu et al. .................. 327/536

* cited by examiner

*Primary Examiner*—Toan Tran
(74) *Attorney, Agent, or Firm*—Lee & Sterba, P.C.

(57) ABSTRACT

In a voltage generator having a voltage level detector, an oscillator, and a voltage pump, the voltage level detector comprises an amplifier, which, in combination with a first and a second linear current source, provides accurate control of an output voltage of the voltage generator. When a sensed voltage deviates around a reference voltage, a differential detection by the amplifier of this deviation causes the oscillator and the voltage pump to provide a corresponding increase or decrease in the magnitude of an output voltage in order to compensate for the deviation. Use of the amplifier and a predetermined reference voltage allows for an accurate threshold detection level for low-voltage, high-speed operation of the voltage generator. The present invention can be used in both positive and negative voltage generators.

29 Claims, 14 Drawing Sheets

50

12

60

80

90

VOLTAGE LEVEL DETECTOR AND VOLTAGE GENERATOR USING THE SAME

BACKGROUND OF THE INVENTION

1. Field of the Invention

The present invention relates to a voltage generator and, more particularly, to a voltage generator using a voltage level detector. The present invention provides a means for accurately monitoring and correcting changes in a sensed voltage rail.

2. Description of the Prior Art

Devices using a battery as a power source generally include a positive voltage generator that internally generates a voltage higher than the battery voltage. Similarly, a conventional semiconductor memory device also includes a positive voltage generator that generates a voltage having a higher magnitude than an applied voltage and a substrate voltage generator that generates a substrate voltage having a lower magnitude than a ground voltage.

Both the positive voltage generator and the substrate voltage generator include a voltage level detector, an oscillator and a pumping circuit. The voltage level detector senses an output voltage and generates a voltage signal that represents whether a sensed voltage is higher or lower than a desired voltage level. The oscillator generates a pulse signal in response to this voltage signal that causes the pumping circuit to change the output voltage to a desired voltage level. The voltage generator is activated only when the output voltage becomes higher or lower than the desired voltage level.

The voltage generator generates a voltage having a triangular wave-shape of a predetermined amplitude and period and that is a function of the speed of the voltage level detector and a capacitance associated with the pumping circuit. The generated voltage changes according to a combination of the pumping circuit capacitance and a load capacitance.

Also, a voltage detection threshold of the detector can vary with process variations, which in turn can cause significant variations in the output voltage of the voltage generator. As a result, the voltage generator cannot generate a stable output voltage, and as the output voltage rises significantly, the detector will operate at a greatly reduced speed.

SUMMARY OF THE INVENTION

To overcome the problems described above, preferred embodiments of the present invention provide a voltage level detector of a voltage generator that can stabilize an output voltage level even though an internal voltage detection threshold level varies. This reduction in the variation range of the output voltage level increases the operating speed of the voltage generator.

In a preferred embodiment of the present invention, a voltage generator comprising a voltage level detector, an oscillator, and voltage booster provides voltage regulation to an on-chip biasing voltage. The voltage level detector further comprises an amplifier element and an accurate analog-to-digital conversion element, the combination of which provides precision control over an output voltage waveshape and thus the response time of the generator.

By employing a first and a second current source in conjunction with a feedback amplifier, a precision voltage theshold can be used to activate a threshold detector which in turn enables a voltage oscillator to provide an appropriate digital pulse signal to the voltage booster. The voltage booster regulates the magnitude of an output voltage which is fed back to the input of the voltage generator. The present invention can be used to create both positive and negative voltage generators.

These and other features of the present invention will be readily apparent to those of ordinary skill in the art upon review of the detailed description that follows.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Korean Patent Application No. 2000-61574, filed on Oct. 19, 2000, entitled "A High Speed and Reliable VPP, VBB Level Detector Circuit" is incorporated herein by reference in its entirety.

Preferred embodiments of the present invention will be described in detail with reference to the accompanying drawings. For simplicity, a voltage label VINT is used throughout the following description to represent a wide variety of internal biasing voltages. As is known in the art, actual biasing voltages can vary widely from circuit to circuit and within a same circuit without restricting the scope of the present invention, and where a plurality of such labels are included in a single schematic, it is not intended to restrict the invention to a single voltage.

Returning now to FIG. 1, a conventional positive voltage generator includes a positive voltage level detector 10, an oscillator 12 and a voltage booster 14. The positive voltage level detector 10 generates a positive voltage detection signal VPPS whenever a sensed voltage VPP decreases below a predetermined threshold voltage. Oscillator 12 generates a pulse signal VPPSS in response to the positive voltage detection signal VPPS. Voltage booster 14 increases VPP in response to the pulse signal VPPSS.

Figure 1:
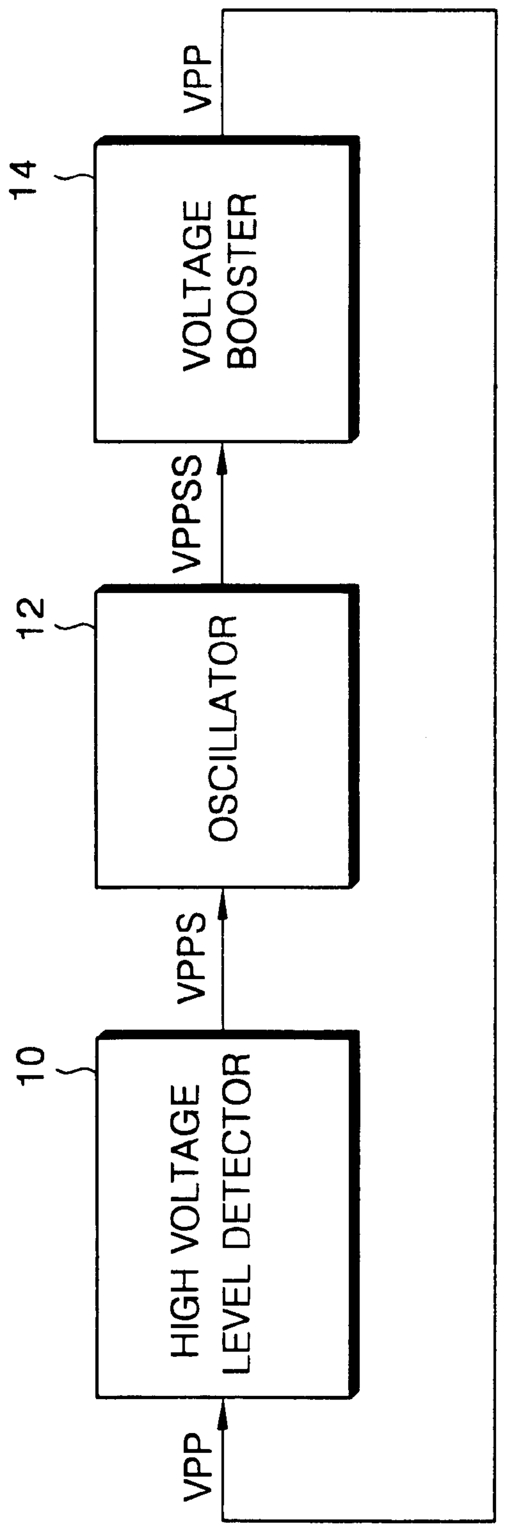
FIG. 1 (PRIOR ART)
FIG. 1 illustrates a block diagram of a conventional positive voltage generator.
Figure 2:
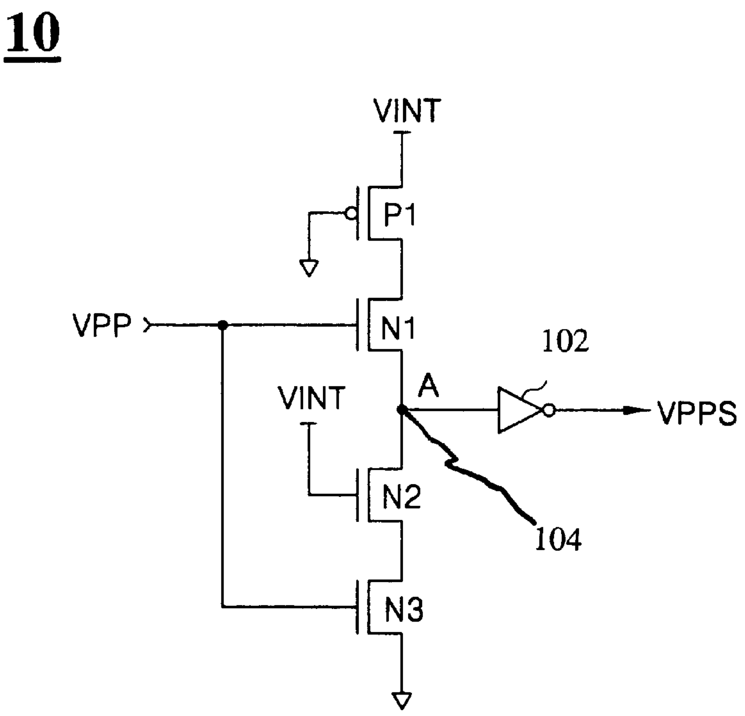
FIG.2 (PRIOR ART)
FIG. 2 illustrates a circuit diagram of a positive voltage level detector element of the conventional positive voltage generator shown in FIG. 1.

FIG. 2 illustrates an exemplary circuit diagram of the positive voltage level detector 10 of FIG. 1. As shown in FIG. 2, the positive voltage level detector 10 includes an attenuator comprised of a PMOS transistor P1, NMOS transistors N1, N2, and N3 and a logical inverter 102. The PMOS transistor P1 and the NMOS transistor N1 are serially connected between an internal power voltage VINT and a node A and have a gate to which a ground voltage and the high voltage VPP are applied, respectively. The NMOS transistors N2 and N3 are serially connected between the node A and the ground voltage and have a gate to which the internal power voltage and the high voltage VPP are applied, respectively. Inverter 102 inverts and buffers a signal of the node A to generate the high voltage detecting signal VPPS. The PMOS transistor P1 and the NMOS transistors N1 to N3 constitute a voltage attenuator. Inverter 102 inverts and buffers a signal at node A 104 to generate a logical positive voltage detection signal VPPS.

If it is assumed that transistors N1 and N2 are operated as linear current sources having transconductances, gm1 and gm2, respectively, and a voltage at node 104 can be represented by the equation $$VA = VPP \frac{gm1}{(gm1 + gm2)} \quad [1]$$

where VA is the voltage at node 104 and Vpp is the analog input sensed voltage, an exemplary voltage attenuation of variations in VPP according to equation [1] can be between 0.1 to 0.4 VPP.

Inverter 102 generates a VPPS signal having a logic "high" level when VA is at a lower voltage than a logic threshold voltage of inverter 102, and generates a logic "low" level when VA is higher than that threshold. However, such a positive voltage level detector can have significant variations in the threshold voltage of inverter 102 due to manufacturing process variations. Such variations can lead to an inaccurate output voltage signal VPPS. For example, assuming that an attenuation of the positive voltage level detector 10 is set to "0.4", and a threshold voltage of the inverter 102 is designed to be 1.5 volts in order to generate an output VPP of 4.0 volts, if a process variation produces a threshold voltage of inverter 102 of 1.6 volts, voltage VPP would be generated at 4.25 volts. Similarly, if the threshold voltage of inverter 102 is manufactured at 1.7 volts, VPP becomes 4.5 volts. From the foregoing it is obvious that a conventional positive voltage level detector 10 cannot generate an accurate positive voltage VPP.

Figure 3:
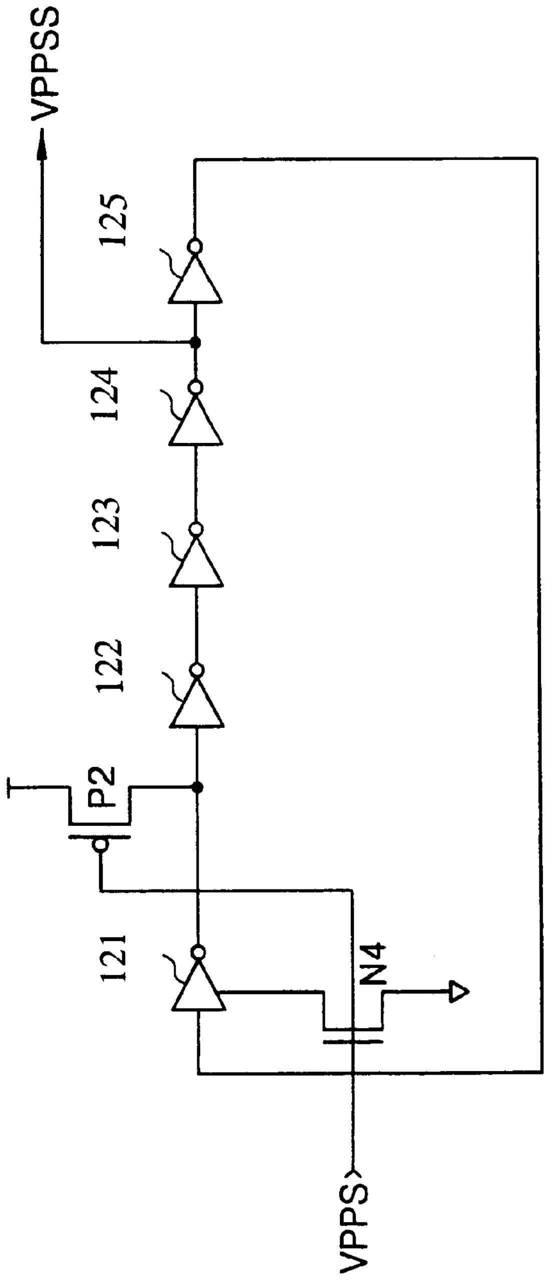
FIG.3 (PRIOR ART)
FIG. 3 illustrates a circuit diagram of an oscillator element of the conventional positive voltage generator shown in FIG. 1.

FIG. 3 illustrates an exemplary circuit diagram of the oscillator 12 of FIG. 1, which includes inverters 121, 122, 123, 124, and 125, an NMOS transistor N4, and a PMOS transistor P2. The inverters 121 to 125 are connected with each other in the form of a ring shape. When a VPPS signal from positive voltage level detector 10 having a logic "high" level is applied, transistor N4 is turned on to enable oscillator 12, and inverters 121 to 125 generate an output pulse signal VPPSS. Conversely, when a logic "low" level is applied at VPPS, transistor P2 is turned on to disable oscillator 12, and output signal VPPSS is held at a logic "low" level.

Figure 4:
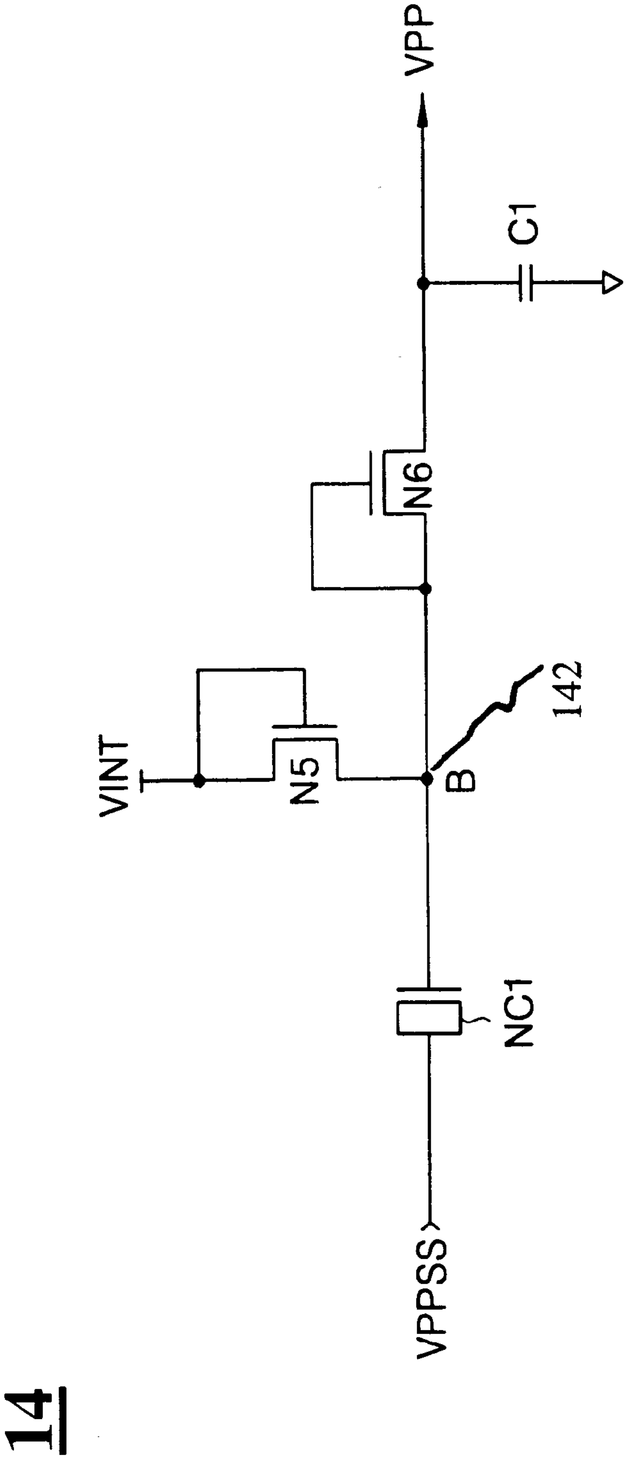
FIG. 4 (PRIOR ART)
FIG. 4 illustrates a circuit diagram of a voltage booster element of the conventional positive voltage generator shown in FIG. 1.

FIG. 4 illustrates an exemplary circuit diagram of the voltage booster 14 of FIG. 1. Voltage booster 14 includes an NMOS capacitor NC1, NMOS transistors N5 and N6, and a capacitor C1. In an exemplary operation, a node B 142 is pre-charged to a voltage (VINT−Vth) where Vth is a threshold voltage of transistor N5. When an input pulse voltage VPPSS makes a transition from a logic "low" to a logic "high" level, the voltage VB at node 142 is boosted by a boosting ratio α of the capacitor NC1 to (VINT−Vth+α VINT), thus turning on transistor N6. VB is then coupled to an output node C, or VPP, causing VPP to rise. As VPP charges to VB less a threshold voltage Vth of transistor N6, transistor N6 turns off, thereby halting the charge transfer to VPP.

Alternatively, when input pulse voltage VPPSS makes a transition from a logic "high" to a logic "low" level, causing voltage VB to drop below VINT−Vth, transistor N5 provides charge to node 142 and capacitor NC1 such that VB rises to a voltage level of VINT−Vth, and subsequent pulse signals on VPPSS cause VPP to reach a voltage {(1+α) VINT−2Vth}. Thus, when output VPP decreases, charge is provided by either capacitor NC1 or transistor N5 via transistor N6 to restore an appropriate output voltage level.

From the above, it is clear that with alternating transitions of VPPSS, VPP will have a triangular waveshape of a predetermined amplitude and period due the charging effects of capacitors NC1 and C1. Further, when the amplitude of the triangular wave of VPP becomes large, the operating speed of the detector of FIG. 2 slow significantly, and voltage VPP that may be measured during an instantaneous test may also vary significantly. Typically, to reduce the foregoing effects, the amplitude of the triangular waveshape can be reduced by reducing the size of input capacitor NC1 and increasing the size of the output capacitor C1.

Figure 5:
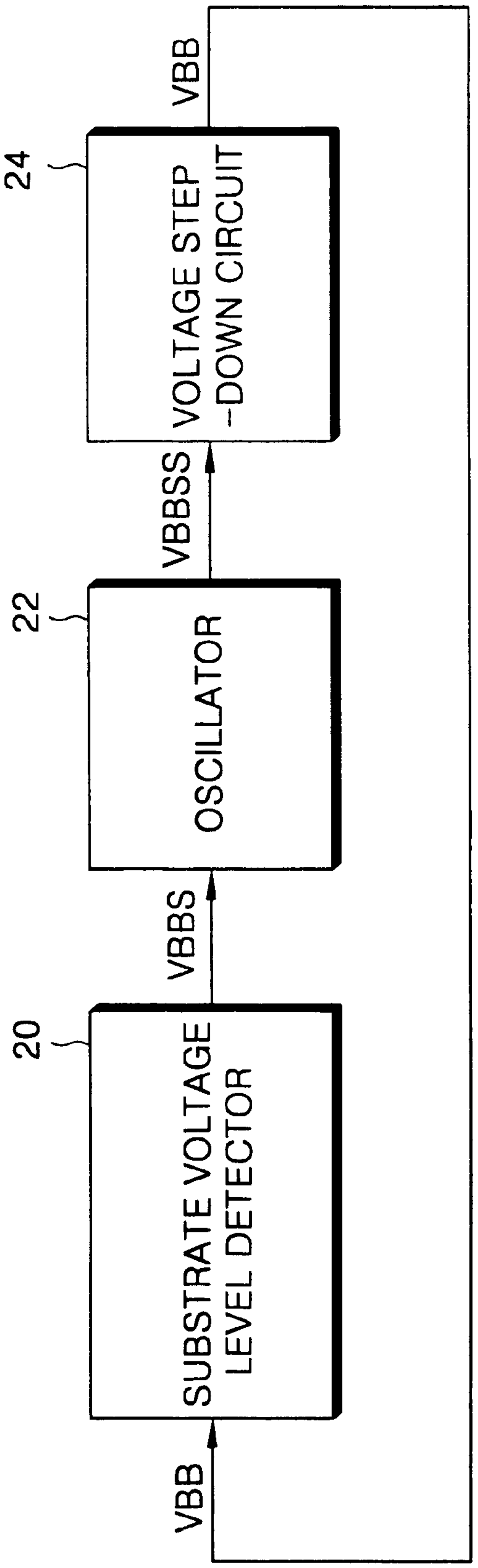
FIG. 5 (PRIOR ART)
FIG. 5 illustrates a block diagram of a conventional substrate voltage generator.

FIG. 5 illustrates a block diagram of a conventional substrate voltage generator used in a semiconductor memory device. The substrate voltage generator includes a substrate voltage level detector 20, an oscillator 22 and a voltage step-down circuit 24. The substrate voltage level detector 20 generates a substrate voltage detection signal VBBS whenever a sensed substrate voltage VBB increases above a predetermined threshold voltage. Oscillator 22 generates a pulse signal VBBSS in response to the substrate voltage detection signal VBBS. Voltage step-down circuit 24 step-downs the substrate voltage VBB in response to the pulse signal VBBSS.

Figure 6:
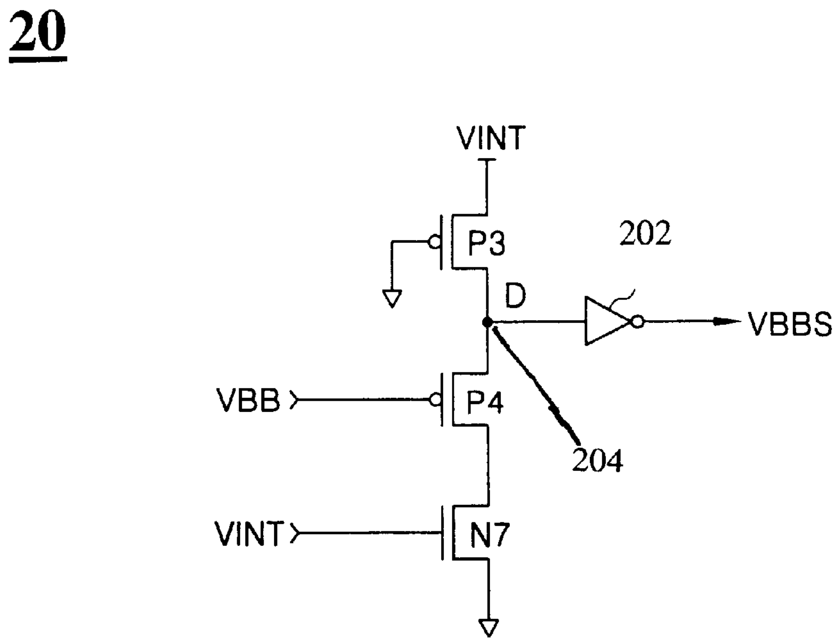
FIG.6 (PRIOR ART)
FIG. 6 illustrates a circuit diagram of a substrate voltage level detector element of the conventional substrate voltage generator shown in FIG. 5.

FIG. 6 illustrates an exemplary circuit diagram of the substrate voltage level detector 20 of FIG. 5. As shown in FIG. 6, the substrate voltage level detector 20 includes PMOS transistors P3 and P4, an NMOS transistor N7 and an inverter 202. The PMOS transistor P3 is connected between an internal power voltage VINT and a node D 204 and has a gate to which a ground voltage is applied. The PMOS transistor P4 and the NMOS transistor N7 are serially connected between node 204 and a ground voltage and have a gate to which the substrate voltage VBB and the internal power voltage VINT are applied, respectively. Inverter 202 inverts and buffers a signal at node 204 to generate the substrate voltage detection signal VBBS. The combination of transistors P3, P4, and N7 constitute a voltage attenuator.

If it is assumed that transconductances of the transistors P3 and P4 are, respectively, "gm3" and "gm4", a voltage at node D 204 can be represented by the equation $$VD = VBB\ \frac{gm3}{(gm3 + gm4)} \qquad [2]$$

where VD is the voltage at node D 204 and VBB is the input sensed voltage. In general, an exemplary voltage attenuation of variation in VBB according to equation [2] can be between 0.1 to 0.4 VBB.

Inverter 202 generates a substrate voltage detection signal VBBS having a logic "high" level when a VD is at a lower voltage than a logic threshold voltage of inverter 202, and generates a logic "low" level when VD is higher. However, like the positive voltage generator of FIG. 2, the substrate voltage level detector 20 can have significant variations in the threshold voltage of inverter 202 due to manufacturing process variations and cannot generate an accurate substrate voltage.

Figure 7:
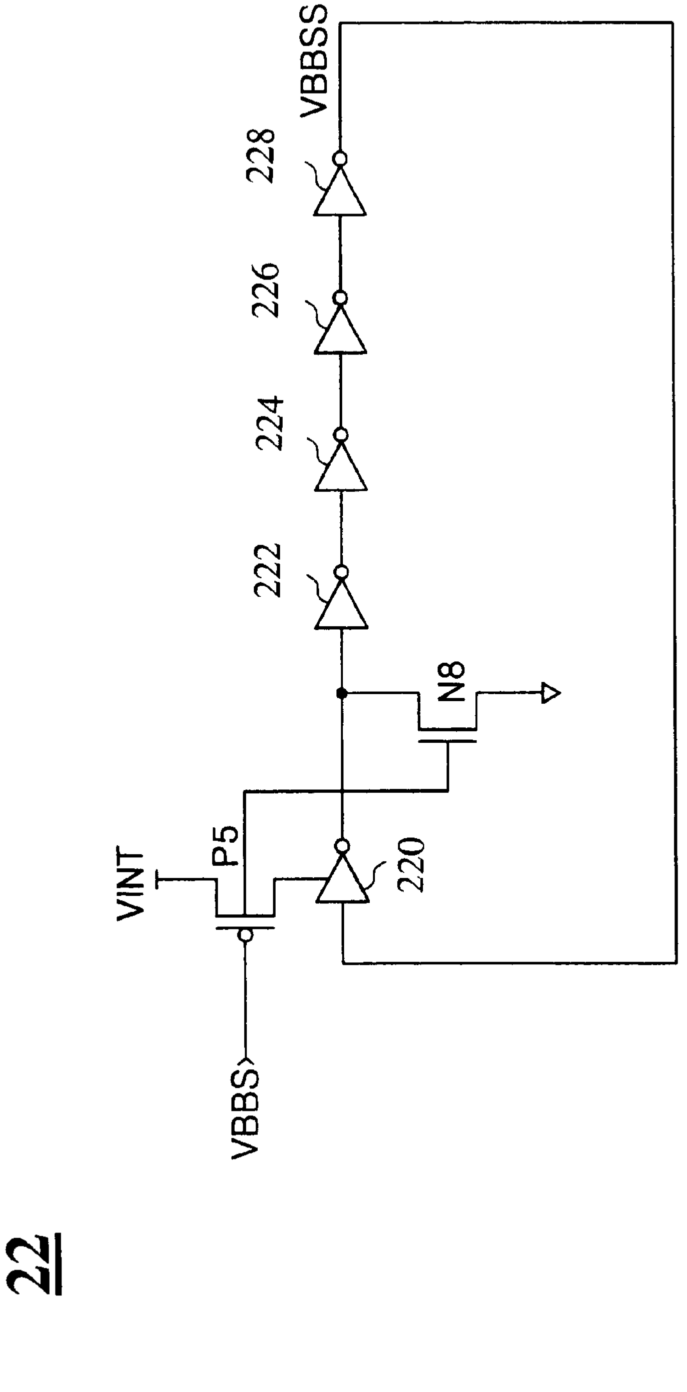
FIG. 7 (PRIOR ART)
FIG. 7 illustrates a circuit diagram of an oscillator element of the conventional substrate voltage generator shown in FIG. 5.

FIG. 7 illustrates an exemplary circuit diagram of the oscillator 22 of FIG. 5. Oscillator 22 includes inverters 220, 222, 224, 226, and 228, a PMOS transistor P5, and an NMOS transistor N8. Inverters 220 to 228 are connected with each other in the form of a ring shape.

When a VBBS signal from substrate voltage level detector 20 having a logic "low" level is applied, transistor P5 is turned on to enable oscillator 22, and inverters 220 to 228 generate an output pulse signal VBBSS. Conversely, when a logic "high" level is applied at VBBS, transistor N8 is turned on to disable oscillator 22, and output signal VBBSS is held at a logic "low" level.

Figure 8:
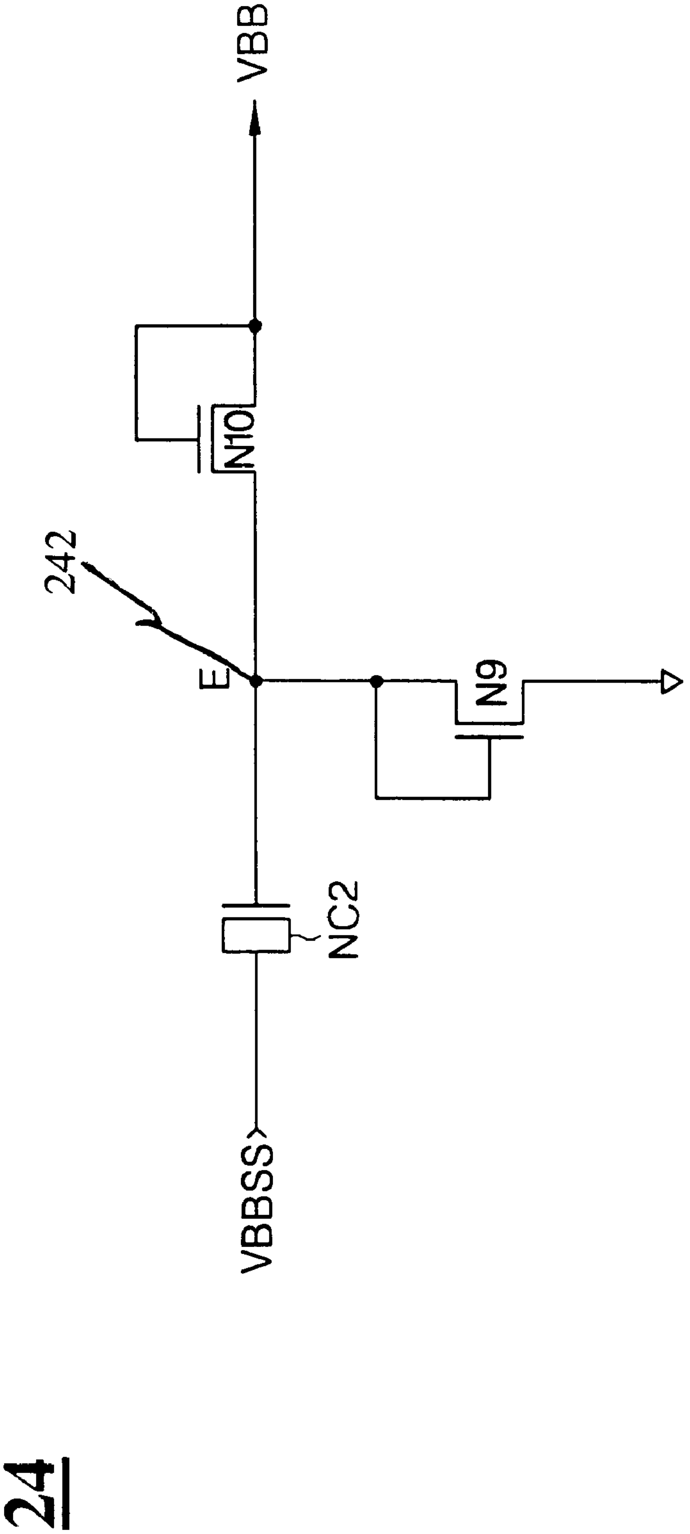
FIG.8 (PRIOR ART)
FIG. 8 illustrates a circuit diagram of a voltage step-down circuit of the conventional substrate voltage generator shown in FIG. 5.

FIG. 8 illustrates an exemplary circuit diagram of the voltage step-down circuit 24 of FIG. 5. The voltage step-down circuit 24 includes an NMOS capacitor NC2 and NMOS transistors N9 and N10.

A voltage at a node E 242 and the substrate voltage VBB are all maintained to be "0" volts. When a pulse signal VBBSS having a logic "high" level is applied, VE is raised to a logic "high" level by capacitor NC2. This causes transistor N9 to turn on draining charge from node 242 and capacitor NC2, thus pre-charging/discharging VE to a threshold voltage level Vth of transistor N9. As VE decreases below the threshold voltage of transistor N9, transistor N9 turns off.

Alternatively, when the pulse signal VBBSS having a transition from a "high" to a "low" logic level is applied, VE is impressed with a voltage Vth−VINT by capacitor NC2, thereby turning on transistor N10 and supplying charge from node 242 to a substrate voltage generating terminal, and VE is raised from a voltage Vth−VINT to a threshold voltage Vth. When VE is equal to the threshold voltage Vth of transistor N10, transistor N10 is turned off, and the substrate voltage VBB is charged to a more negative voltage.

By repeatedly performing the operation described above, the substrate voltage VBB is gradually lowered, and when the substrate voltage VBB is equal to a predetermined voltage (2Vth−VINT), a charge supply from node 242 is halted. At this point, in a manner similar to the positive voltage generator 14 of FIG. 2, the substrate voltage signal VBB outputted from the voltage step-down circuit 24 has a triangular wave-shape having a predetermined amplitude and period, and when the amplitude of the triangular wave of the substrate voltage VBB becomes large, the operating speed of the substrate voltage level detector slows.

The present invention is directed to improving the positive voltage level detector 10 and the substrate voltage level detector 20 to overcome the foregoing problems relating to speed and accuracy.

Figure 9:
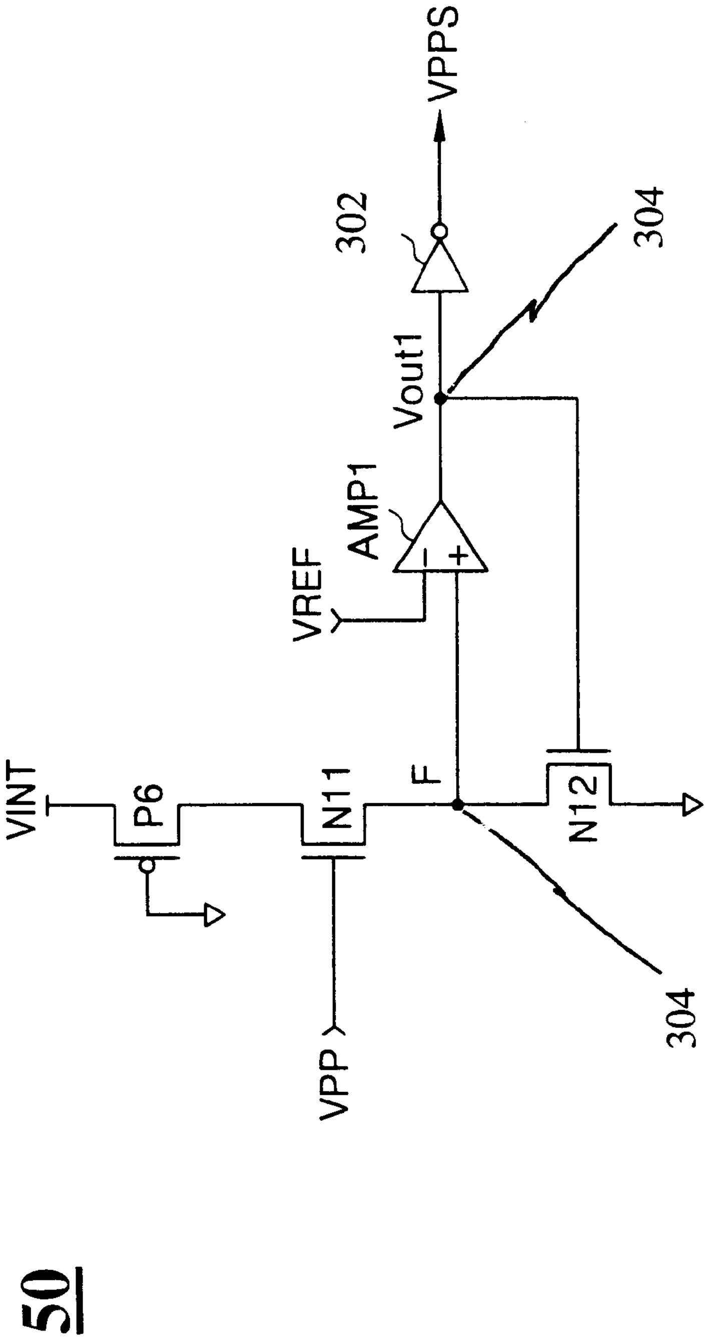
FIG. 9 illustrates an exemplary circuit diagram of a positive voltage level detector element according to a preferred embodiment of the present invention.

FIG. 9 illustrates an exemplary circuit diagram of a positive voltage level detector according to a preferred embodiment of the present invention. The positive voltage level detector 50 includes a PMOS transistor P6, NMOS transistors N11 and N12, a differential amplifier AMP1, and an inverter 302.

The PMOS transistor P6 and the NMOS transistor N11 are serially connected between an internal power voltage VINT and a node F and have a gate to which a ground voltage and a high voltage VPP are applied, respectively. The NMOS transistor N12 is connected between the node F and a ground voltage and has a gate to which a voltage Vout1 is applied. Differential amplifier AMP1 amplifies a voltage difference between a reference voltage VREF and a voltage at a node F 304 to generate a controlled intermediate output voltage Vout1 at a node 306. Inverter 302 inverts and buffers the voltage Vout1 to generate a positive voltage detection signal VPPS.

If it is assumed that transistors N11 and N12 are operated as linear current sources having transconductances, gm5 and gm6, respectively, when an input positive voltage VPP is raised, a current (gm5×ΔVPP) flows to node 304. A feedback current (gm6×ΔVout1) flows from node 304 though transistor N12 under control of voltage Vout1 at node 306. A feedback loop associated with a linear feedback amplifier AMP1 will cause the output of amplifier AMP1 to change such that node 306 remains at a constant voltage that is equal to VREF. Thus, amplifier AMP1 in conjunction with VREF provides a precision threshold voltage for determining the output voltage VPPS, and satisfies the equation gm5×ΔVPP=gm6×ΔVout1.

For a brief overview of the operation, when analog input voltage VPP decreases, the current flowing in transistor N11 decreases, and the voltage at node 306 is correspondingly lowered. Differential amplifier AMP1 compares the voltage at node 306 with the reference voltage VREF and lowers the voltage Vout1. This causes the amount of current flowing through transistor N12 to proportionately decrease, such that the voltage at node 306 is restored to be equal to VREF. Similarly, an increase in VPP will cause a corresponding increase in the voltages at node 304 and at node 306 as well as in the current conducting in transistor N12.

Inverter 302 generates VPPS having a binary logic "high" level when VPP is lowered such that voltage Vout1 is lower than the threshold voltage and generates VPPS having a binary logic "low" level when VPP is boosted so that voltage Vout1 is higher than the threshold voltage.

A voltage gain Av (i.e., ΔVout1/ΔVPP) of the positive voltage level detector 50 of FIG. 9 can be represented as "gm5/gm6", and therefore, a voltage gain can be made higher than "1" by adjusting transconductance values of the transistors N11 and N12. For example, assuming that a voltage gain of the positive voltage detector 50 is set to "1.2," and a threshold voltage of the inverter 302 is designed to be 1.5 volts in order to generate the output positive voltage VPP of 4.0 volts, if the threshold voltage of the inverter 302 is manufactured at 1.6 volts due to a process variation, the output VPP would be raised to 4.08 volts. Similarly, when the threshold voltage is manufactured to 1.7 volts, the VPP would be raised to 4.16 volts.

Therefore, even though a threshold voltage of the inverter 302 can vary significantly due to a process variation, the positive voltage level detector 50 of the present invention can generate a stable positive voltage VPP by making the variations in the positive voltage VPP much lower than the variations in the threshold voltage. Further, VPP is stable, thereby reducing amplitude variations in the output triangular wave and, thus, providing a higher operating speed over conventional embodiments.

Figure 10:
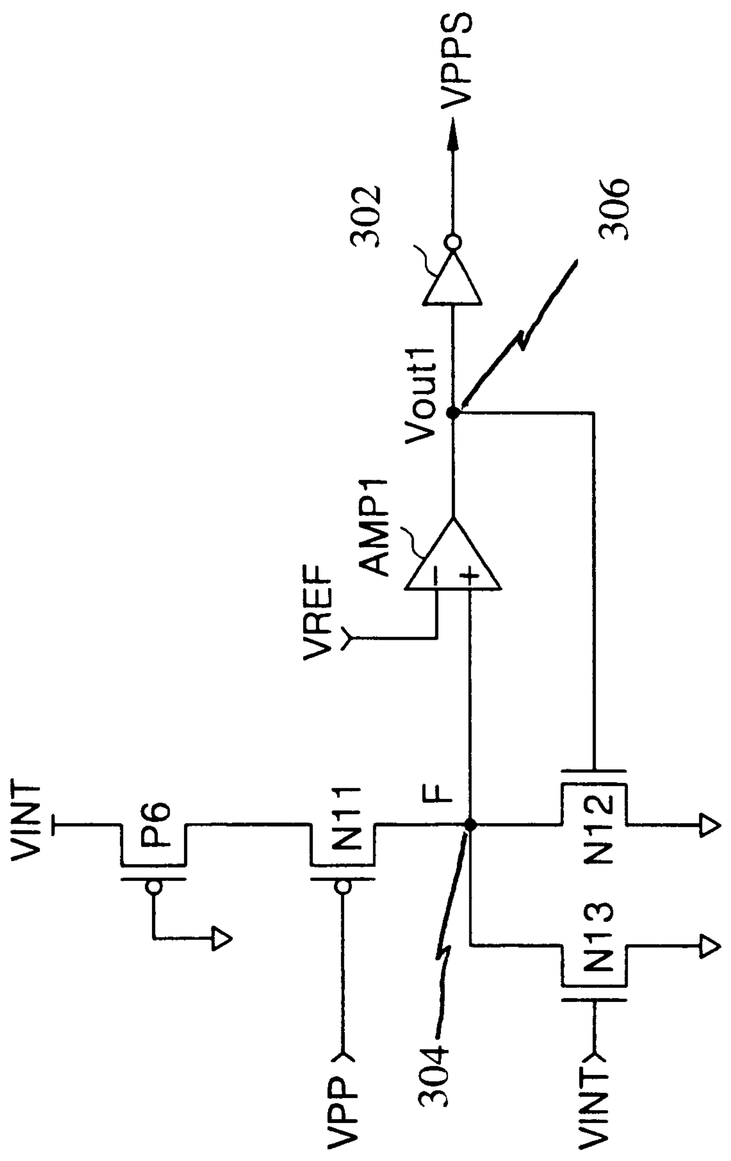
FIG. 10 illustrates an exemplary circuit diagram of an alternate embodiment of the positive voltage level detector element shown in FIG. 9 according to the present invention.

FIG. 10 illustrates an exemplary circuit diagram 60 having a modification of the positive voltage level detector according to an alternate embodiment of the present invention. In positive voltage level detector 50 of FIG. 9, an NMOS transistor N13 can be added between the node 304 and a ground voltage. Transistor N13 is turned on in response to the internal power voltage VINT. This added transistor N13 can be used to improve variations in VPP with respect to an external power voltage VEXT during a burn-in test of a semiconductor memory device.

Figure 11:
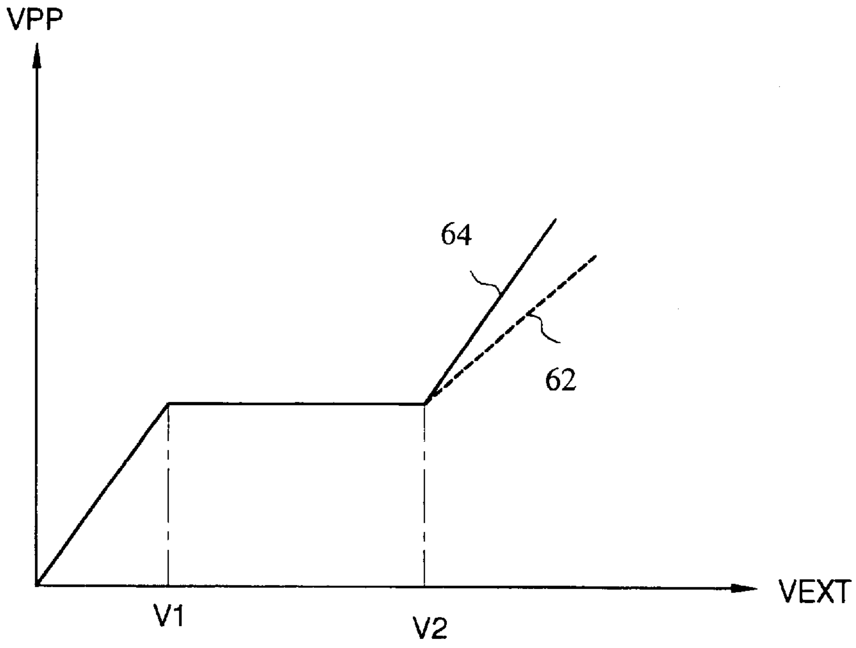
FIG. 11 illustrates a graph showing variations of a high voltage with respect to an external power voltage during a burn-in test of a semiconductor memory device. manufactured according to the present invention.

FIG. 11 illustrates an exemplary graph showing variations in VPP with respect to the external power voltage VEXT during a burn-in test of a semiconductor memory device. In the graph of FIG. 11, a dotted line 62 denotes an ideal variation in VPP with respect to VEXT, and a solid line 64 denotes a variation in VPP with respect to VEXT when the positive voltage level detector 50 of FIG. 9. is employed in the positive voltage generator according to a preferred embodiment of the present invention.

In an alternate embodiment of the circuit diagram shown in FIG. 10, when VEXT is raised to be higher than a voltage V2, transistor N13 draws current away from node 304 to the ground voltage, causing the positive voltage level detector 60 of FIG. 10 to generate the characteristics of dotted line 62 of FIG. 11, i.e. when the external power voltage VEXT is raised to be higher than a voltage V2, the internal power voltage VINT, which has identical characteristics as the graph shown in FIG. 11, is applied to the gate of the transistor N13 so that a larger amount of a current flows through transistor N13. Therefore, even though a larger current flows to node 304 through the transistor N11 due to increases in VPP, the positive voltage level detector of FIG. 10 can have similar characteristics to the dotted line 62 of FIG. 11 due to the sinking capabilities provided by transistor N13.

Figure 12:
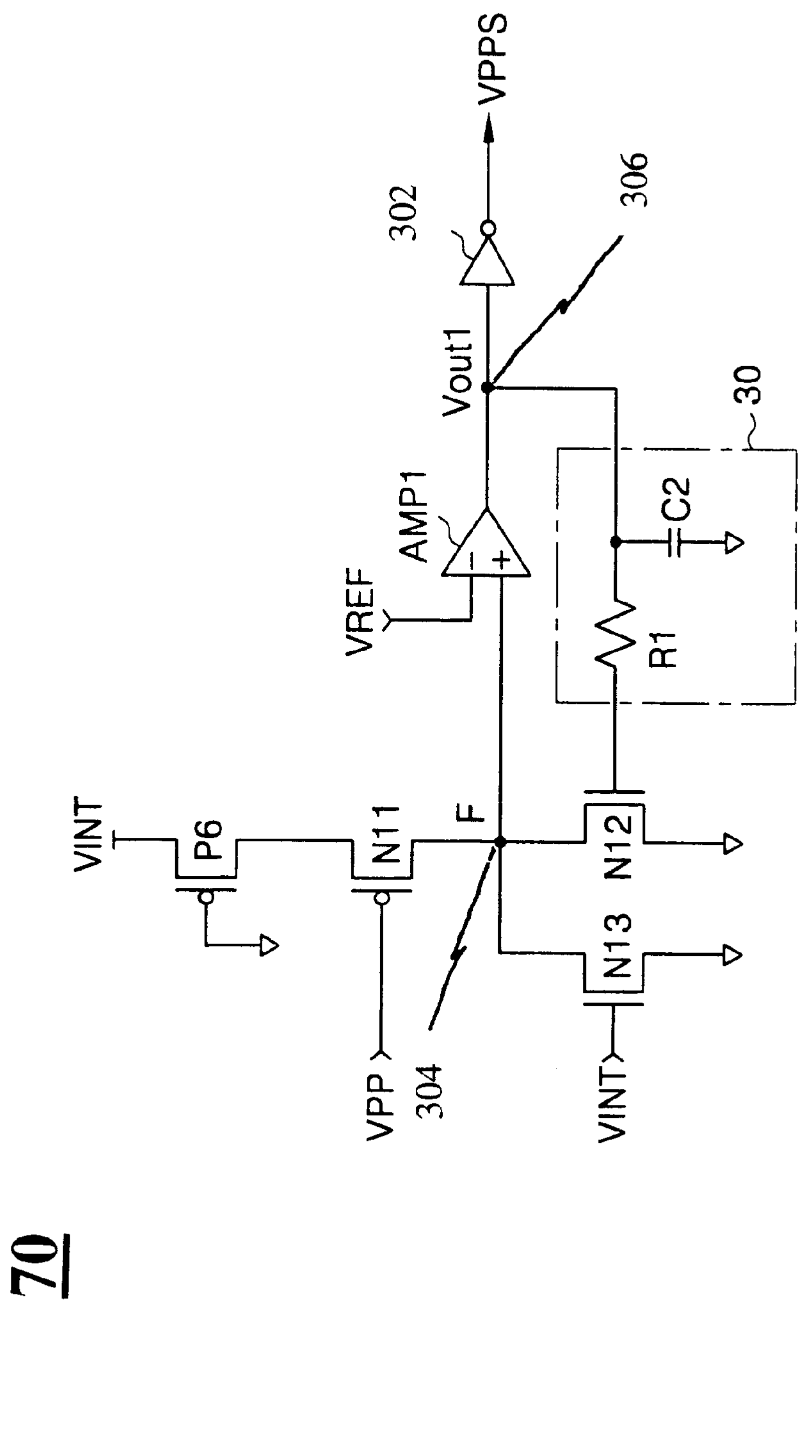
FIG. 12 illustrates an exemplary circuit diagram of another embodiment of the positive voltage level detector element shown in FIG. 10 according to the present invention.

FIG. 12 illustrates an exemplary circuit diagram having a modification of a positive voltage level detector 70 according to another embodiment of the present invention. In addition to the positive voltage level detector 60 of FIG. 10, a low-pass resistor-capacitor combination (RC) loop filter 30 is added between node 306 of differential amplifier AMP1 and the gate of transistor N12, which includes a resistor R1 connected between node 306 and the gate of the transistor N12, and a capacitor C2 connected between node 306 and a ground voltage. RC Loop filter 30 provides for a removal of high frequency components that can be contained in the output voltage Vout1 before applying that signal to the gate of the transistor N12, thereby stabilizing the operation of the positive voltage level detector 70.

Figure 13:
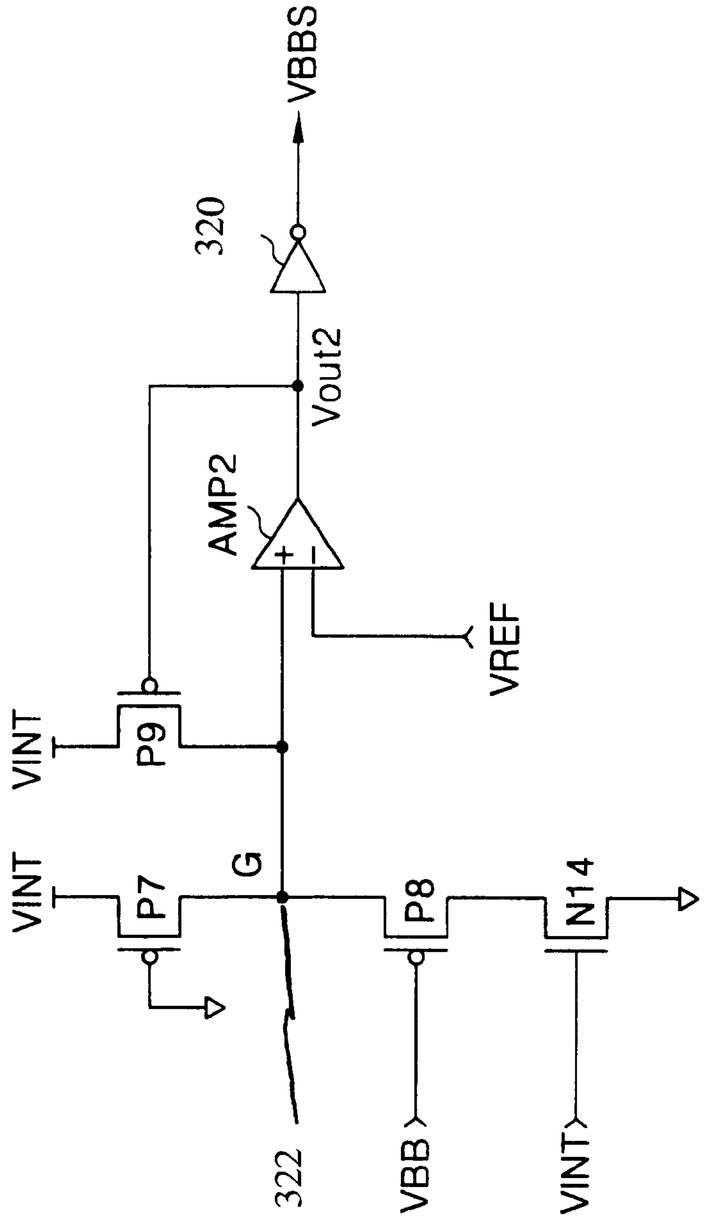
FIG. 13 illustrates an exemplary circuit diagram of a substrate voltage level detector according to a preferred embodiment of the present invention.

FIG. 13 illustrates an exemplary circuit diagram of a negative substrate voltage level detector 80 according to a preferred embodiment of the present invention. As shown in FIG. 13, the substrate voltage level detector 80 includes PMOS transistors P7, P8, and P9, an NMOS transistor N14, a differential amplifier AMP2, and an inverter 320.

The substrate voltage level detector 80 shown in FIG. 13 is similar to substrate voltage level detector 20 shown in FIG. 6, but additionally includes a PMOS transistor P9 connected between an internal power voltage VINT and a node G 322 and having a gate to which an output voltage Vout2 is applied and the differential amplifier AMP2 amplifying a voltage difference between a voltage of node 322 and a reference voltage VREF to generate the output voltage Vout2.

If it is assumed that transconductances of the transistors P8 and P9 are "gm7" and "gm8", respectively, a current flowing along the PMOS transistor P8 is "i1", and a current flowing along the PMOS transistor P9 is "i2". A current Δi2 can be represented as "gm8×ΔVBB", and a current Δi1 can be represented as "gm7×ΔVout2". When a current i1 is equal to a current i2, a voltage gain ΔVout2/ΔVBB is represented as "gm8/gm7". Therefore, when the equation "gm8×ΔVBB=gm7×ΔVout2" is satisfied, a voltage of node 322 can be maintained at a constant level, and the output voltage Vout2 of differential amplifier AMP2 can also be maintained at a constant level.

When analog input substrate voltage VBB decreases in magnitude so that the current flowing in transistor P8 increases, a voltage at node 322 decreases. Differential amplifier AMP2 compares the voltage at node 322 with the reference voltage VREF and lowers the output voltage Vout2 to increase an amount of a current flowing through transistor P9 when a voltage at node 322 is lower than VREF.

Alternatively, when the analog input substrate voltage VBB increases such that the current flowing through the transistor P8 is decreased, the voltage at node 322 increases. The differential amplifier AMP2 compares the voltage at node 322 with the reference voltage VREF and raises the output voltage Vout2 to decrease an amount of a current flowing in transistor P9, thereby lowering the voltage at node 322.

Inverter 320 generates a substrate voltage detection signal VBBS having a binary logic "high" level when the analog input substrate voltage drops and the output voltage Vout2 becomes lower than a threshold voltage thereof, and generates the substrate voltage detecting signal VBBS having a binary logic "low" level when the analog input substrate voltage is raised and the output voltage Vout2 becomes higher than a threshold voltage thereof.

Figure 14:
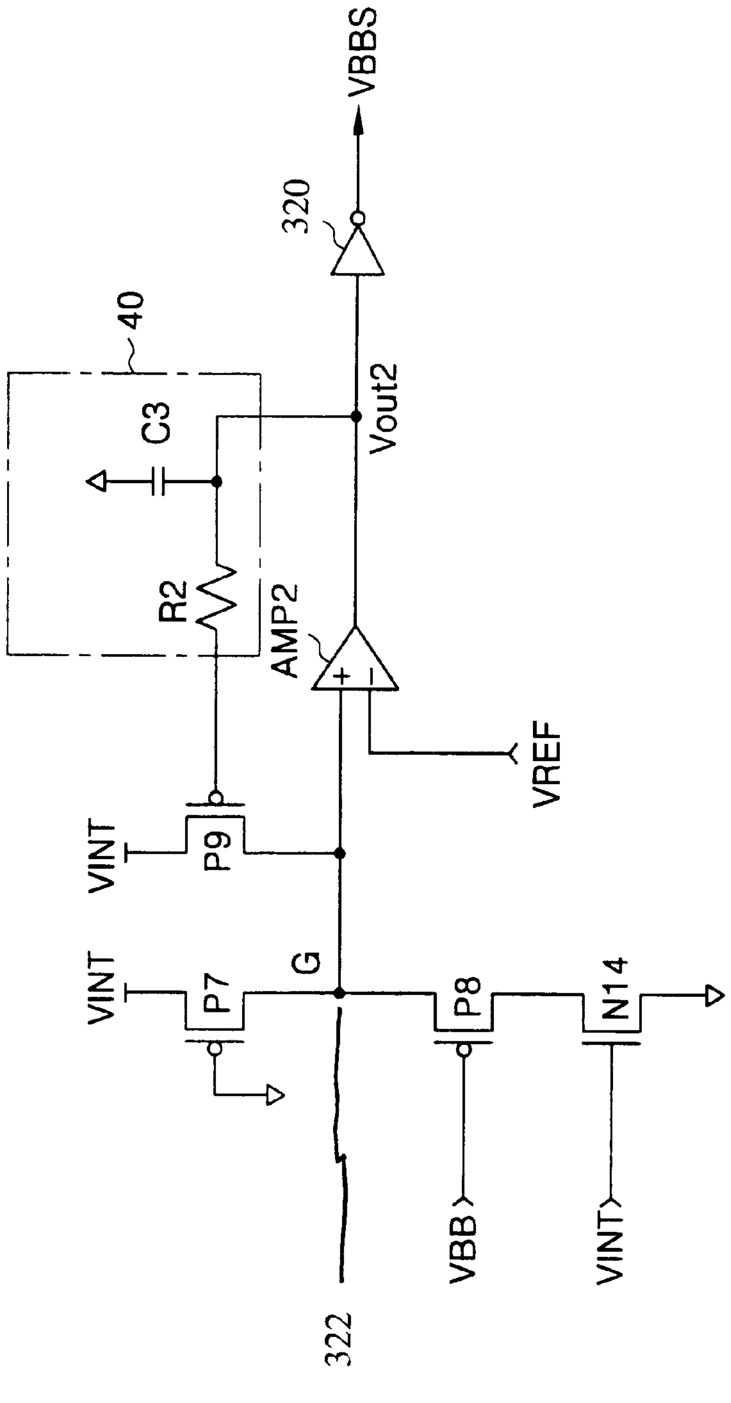
FIG. 14 illustrates an exemplary circuit diagram of an alternate embodiment of the substrate voltage level detector shown in FIG. 13 according to the present invention.

FIG. 14 illustrates a circuit diagram having a modification to the substrate voltage level detector shown in FIG. 13. The substrate voltage level detector 90 of FIG. 14 further includes a RC loop filter 40 in addition to substrate voltage level detector 80 shown in FIG. 13. The RC loop filter 40 includes a resistor R2 and a capacitor C3 between a node of the output voltage Vout2 and a gate of the PMOS transistor P9. The RC loop filter 40 serves to remove a high frequency component contained in the output voltage Vout2 before applying the signal to the gate of the transistor P9, thereby stabilizing the operation of substrate voltage level detector 90.

The positive voltage generator and the substrate voltage generator according to the preferred embodiments of the present invention can be applied to all devices that utilize a battery as a power source and that also require a higher voltage or a lower voltage than the voltage of the battery as well as the semiconductor memory device.

As described hereinabove, the voltage level detectors according to preferred embodiments of the present invention exhibit significant advantages. Even though a logical voltage detection threshold can vary widely due to process variations, a stable voltage having small or minor variation can be generated. Also, this leads to a decreased amplitude of the input sensed voltage, which allows for a higher operating speed of the detector stage.

Preferred embodiments of the present invention have been disclosed herein, and although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A positive voltage level detector, comprising:

a first current generating means serially connected between a power voltage and an intermediate node and generating a first current corresponding to an input positive voltage;

a second current generating means connected between the intermediate node and a ground voltage and generating a second current corresponding to a feedback voltage;

an amplifying means for amplifying a difference between a voltage of the intermediate node and a reference voltage to generate the feedback voltage; and a voltage generating means for receiving the feedback voltage and generating a corresponding voltage detection signal.

2. A positive voltage level detector as claimed in claim 1, wherein a variation in the first current is equal to a variation in the second current.

3. A positive voltage level detector as claimed in claim 1, wherein the first current generating means includes a first PMOS transistor and a first NMOS transistor which are serially connected between the power voltage and the intermediate node, each having a gate to which a ground voltage and the input positive voltage are applied, respectively.

4. A positive voltage level detector as claimed in claim 1, wherein the second current generating means includes a second NMOS transistor connected between the intermediate node and the ground voltage and having a gate to which the feedback voltage is coupled.

5. A positive voltage level detector as claimed in claim 4, further comprising, a third NMOS transistor connected between the intermediate node and the ground voltage and having a gate to which the power voltage is applied.

6. A positive voltage level detector as claimed in claim 1, further comprising an RC filtering means for filtering the feedback voltage before applying the feedback voltage to the second current generating means.

7. A positive voltage level detector as claimed in claim 1, wherein the voltage generating means comprises an inverter for inverting and buffering the feedback voltage.

8. A negative voltage level detector, comprising:

a first current generating means connected between an intermdeiate node and a ground voltage and generating a first current corresponding to an input negative voltage;

a second current generating means connected between a power voltage and the intermediate node and generating a second current corresponding to a feedback voltage;

an amplifying means for amplifying a difference between a voltage of the intermediate node and a reference voltage to generate the feedback voltage; and a voltage generating means for receiving the feedback voltage and generating a corresponding voltage detection signal.

9. A negative voltage level detector as claimed in claim 8, wherein a variation in the first current is equal to a variation in the second current.

10. A negative voltage level detector as claimed in claim 8, wherein the first current generating means comprises a first PMOS transistor and a first NMOS transistor that are serially connected between the intermediate node and a ground voltage, each having a gate to which a negative voltage and a power voltage are coupled, respectively.

11. A negative voltage level detector as claimed in claim 8, wherein the second current generating means includes second and third PMOS transistors that are connected in a parallel manner between a power voltage and the intermediate node, each having a gate to which the ground voltage and the feedback voltage are coupled, respectively.

12. A negative voltage level detector as claimed in claim 8, further comprising an RC filterering means for filtering the feedback voltage before applying the feedback voltage to the second current generating means.

13. A negative voltage level detector as claimed in claim 8, wherein the voltage generating means comprises an inverter for inverting and buffering the feedback voltage.

14. A positive voltage generator, comprising:

a detecting means for detecting an analog input voltage and generating a corresponding output logic signal, the detecting means having:

a signal amplifying means; and a binary output signal generating means;

an oscillating means for generating a pulse signal in response to a binary output signal of the detecting means; and a voltage boosting means for boosting the analog input voltage in response to the pulse signal.

15. A positive voltage generator as claimed in claim 14, wherein the signal amplifying means comprises:

a first current generating means connected between a power voltage and an intermediate node and generating a first current corresponding to an input positive voltage;

a second current generating means connected between the intermediate node and a ground voltage and generating a second current corresponding to a feedback voltage; and an amplifying means for generating the feedback voltage corresponding to a difference between a voltage at the intermediate node and a reference voltage.

16. A positive voltage generator as claimed in claim 15, wherein a variation in the first current is equal to a variation in the second current.

17. A positive voltage generator as claimed in claim 15, wherein the first current generating means comprises a first PMOS transistor and a first NMOS transistor that are serially connected between the power voltage and the intermediate node, each having a gate to which a ground voltage and the input positive voltage are coupled, respectively.

18. A positive voltage generator as claimed in claim 17, wherein the second current generating means comprises a second NMOS transistor connectively coupled between the intermediate node and the ground voltage and having a gate to which the feedback voltage is coupled.

19. A positive voltage generator as claimed in claim 18, wherein the current generating means includes a third NMOS transistor connectively coupled between the intermediate node and the ground voltage and having a gate to which the power voltage is coupled.

20. A positive voltage generator as claimed in claim 15, wherein the signal amplifying means comprises a differential amplifying means for amplifying a difference between a voltage of the intermediate node and a reference voltage in order to generate the feedback voltage.

21. A positive voltage generator as claimed in claim 20, wherein the binary output signal generating means comprises an inverter for inverting and buffering the feedback voltage.

22. A positive voltage generator as claimed in claim 15, wherein the signal amplifying means further includes a RC filtering means for filtering the feedback voltage before applying the feedback voltage to the second current generating means.

23. A negative voltage generator, comprising:

a detecting means for detecting an analog input voltage and generating a corresponding output logic signal, the detecting means having:

a signal amplifying means, the signal amplifying means comprising a first current generating means connected between an intermediate node and a ground voltage and generating a first current corresponding to a input negative voltage, and a second current generating means connected between a power voltage and the intermediate node and generating a second current corresponding to a feedback voltage, and a binary output signal generating means;

an oscillating means for generating a pulse signal in response to a binary output signal of the detecting means; and a voltage step-downing means for step-downing the analog input voltage in response to the pulse signal.

24. A negative voltage generator as claimed in claim 23, wherein a variation of the first current is equal to a variation in the second current.

25. A negative voltage generator as claimed in claim 23, wherein the signal amplifying means further comprises a differential amplifying means for amplifying a difference between a voltage of the intermediate node and a reference voltage in order to generate the feedback voltage.

26. A negative voltage generator as claimed in claim 25, wherein the binary output signal generating means comprises an inverter for inverting and buffering the feedback voltage.

27. A negative voltage generator as claimed in claim 23, wherein the first current generating means comprises a first PMOS transistor and a first NMOS transistor that are serially connected between the intermediate node and a ground voltage and have a gate to which a negative input voltage and a power voltage are coupled, respectively.

28. A negative voltage generator as claimed in claim 23, wherein the second current generating means includes second and third PMOS transistors connected in a parallel manner between a power voltage and the intermediate node and having a gate to which a ground voltage and the feedback voltage are coupled, respectively.

29. A negative voltage generator as claimed in claim 23, wherein the voltage detecting means includes an RC filtering means for filtering the feedback voltage to apply the filtered feedback voltage to the current generating means.

* * * * *